United States Patent

Conner

[15] 3,644,840

[45] Feb. 22, 1972

[54] VARIABLE FREQUENCY CONTROL

[72] Inventor: David C. Conner, Dallas, Tex.

[73] Assignee: LTV Electrosystems, Inc., Greenville, Tex.

[22] Filed: May 28, 1970

[21] Appl. No.: 41,246

[52] U.S. Cl. ....................331/1 A, 331/107 T

[51] Int. Cl. ....................H03b 3/04

[58] Field of Search ....................331/1 A, 18, 25, 1

[56] References Cited

UNITED STATES PATENTS

| | | | |
|---|---|---|---|
| 3,185,938 | 5/1965 | Pelosi | 331/1 A |
| 3,484,712 | 12/1969 | Foote et al. | 331/1 A |

*Primary Examiner*—John Kominski

*Attorney*—Richard, Harris & Hubbard and James D. Willborn

[57] ABSTRACT

A variable frequency oscillator is digitally commanded to any one of a large number of frequencies by a system that involves closing a sample data frequency servomechanism loop around a voltage (or current) controlled oscillator. In the sample data frequency loop, a phase-locked subharmonic oscillator produces a sampled frequency at a fraction of the oscillator output. This sampled frequency is applied to a logic system that produces a frequency error signal by an arithmetic operation of subtraction and addition. This frequency error signal is then utilized to adjust the controllable oscillator.

21 Claims, 9 Drawing Figures

INVENTOR:
DAVID C. CONNER

Richards, Harris & Hubbard
ATTORNEYS

INVENTOR:
DAVID C. CONNER

Richards, Harris & Hubbard
ATTORNEYS

INVENTOR:
DAVID C. CONNER

Richards, Harris & Hubbard
ATTORNEYS

VARIABLE FREQUENCY CONTROL

This invention relates to frequency control, and more particularly to a system for controlling the frequency output of a variable frequency source.

When it is necessary to accurately control an oscillator output frequency in the higher frequency ranges, one of the most significant problems is the determination of the actual output frequency of the oscillator. Primarily, this is because direct (cycle by cycle) counting has been shown to be practical only up to approximately 500 MHz. Beyond 500 MHz, transfer oscillators and heterodyne converters are commonly used to translate microwave frequencies down to a level such that they may be counted directly. Both of these techniques, however, suffer from bandwidth imitations since less than 500 MHz is the maximum bandwidth that can be covered by either at any one frequency translation setting. Because of the problem of determining the oscillator output frequency at the higher frequencies, some attempts have been made to operate digitally controlled oscillators in an open loop mode. If the stability and linearity of both the digital-to-analog converter and the voltage-controlled oscillator are good, then the system will provide some degree of frequency stability and accuracy. Usually, however, the oscillator voltage-to-frequency characteristic is nonlinear and temperature dependent. Also, the digital-to-analog converter will introduce small errors due to its linearity and temperature characteristics.

It is an object of the present invention to provide a closed loop digitally controlled system for a variable frequency source. Another object of this invention is to provide a system for wide bandwidth variable frequency control. A further object of this invention is to provide improved counting accuracy of oscillator output frequency in the higher frequency ranges. Still another object of this invention is to provide digital arithmetic determination of oscillator output deviation from a desired frequency.

In accordance with one embodiment of this invention, a subharmonic oscillator (SHO) is frequency locked to the output of a voltage-controlled oscillator. This subharmonic oscillator generates an output frequency at some fraction of the frequency from the controllable source. An automatic lock-determining circuit coupled to the SHO controls a bias adjusting network for supplying a signal to the SHO to lock the output thereof at a fixed fraction of its input frequency. Coupled to the output of a subharmonic oscillator is a logic system for calculating the error of the controllable oscillator output from a desired frequency setting. This logic system determines the error frequency by an arithmetic operation that includes subtraction and addition of the subharmonic oscillator output with a desired frequency signal. Both the desired frequency signal and the error frequency are converted into an analog signal for control of the variable frequency source.

In accordance with another embodiment of the invention, the output frequency of a variable frequency source is controlled by a system that includes means responsive to a desired frequency input and an error frequency input to generate a control signal to the variable source. A frequency divider responds to the output of the frequency source and produces a frequency locked at a fraction of the source frequency as determined by a frequency lock circuit. The output of the divider is applied to a network for subtracting the divider output from a desired frequency signal until the network output equals an error signal difference between the desired frequency of the variable source and the actual frequency of said source.

A more complete understanding of the invention and its advantages will be apparent from the specification and claims and from the accompanying drawings illustrative of the invention.

Referring to the drawings.

GENERAL OPERATION

Figure 1:
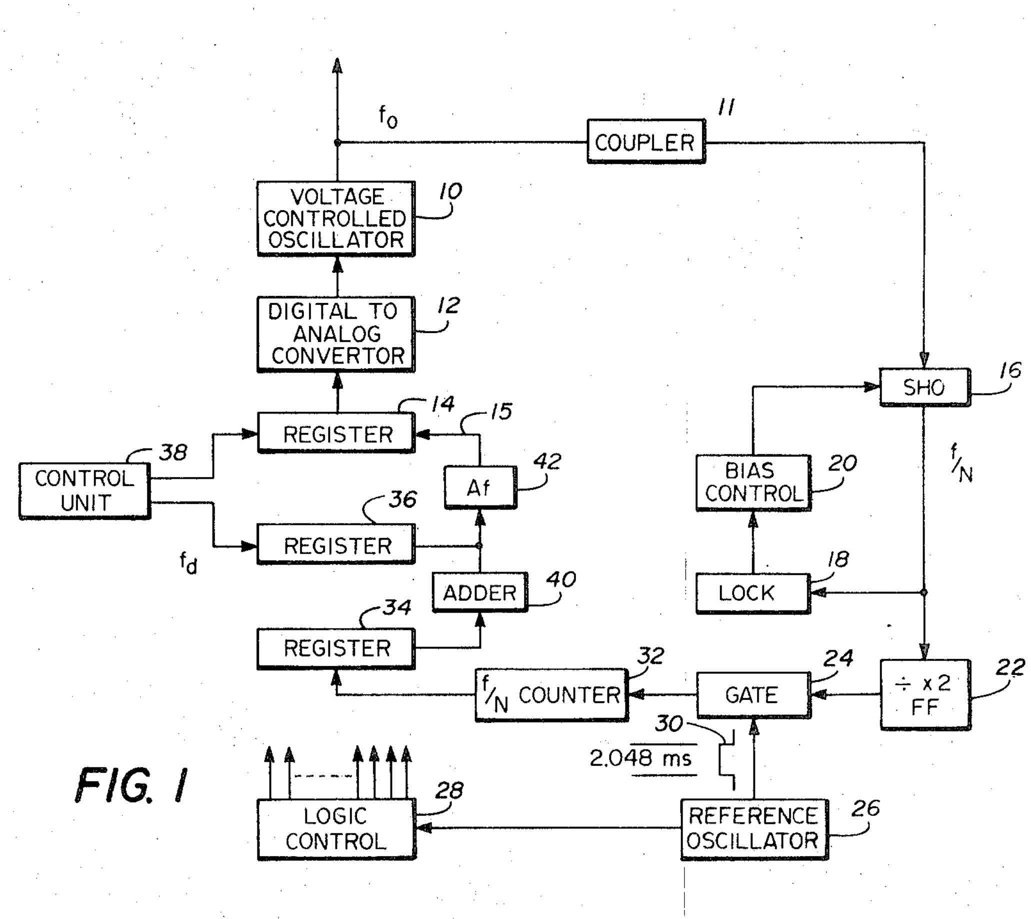
FIG. 1 is a block diagram of a wide bandwidth controllable oscillator in accordance with the present invention.

Referring to FIG. 1, there is shown a system for accurately controlling the output frequency of a voltage-controlled oscillator (VCO) 10 by means of a control signal from a digital-to-analog converter 12. Although a voltage controlled oscillator is discussed, it will be understood that the digital-to-analog converter 12 may also produce a current signal to a frequency source response to current control.

A digital register 14 forms part of a logic network for generating a digital word representative of the desired frequency from the oscillator 10. Register 14 has an output terminal connected to the D/A converter 12. The desired VCO frequency ($f_d$), plus an error frequency $\Delta f$, are shifted into register 14 along a line 15 after a logic operation to be described. This digital word is converted into an analog control signal which commands the VCO to oscillate at a frequency $f_o$.

The difference between the desired frequency ($f_d$) and the achieved frequency ($f_o$) is the error to be corrected by a feedback loop that includes a subharmonic oscillator (SHO) 16 having an input terminal receiving an attenuated frequency signal from the VCO 10 through typically a 20 db. coupler 11. The output frequency of the subharmonic oscillator 16 will adjust itself to a subharmonic of the controlled oscillator frequency ($f_o$), with the subharmonic frequency at a fraction of the oscillator output frequency.

To lock the output of the subharmonic oscillator 16 to a subharmonic of the output of the oscillator 10, a lock circuit 18 determines the locked or not locked condition of the SHO. When the circuit 18 establishes that the output of the oscillator 16 is not locked into its input, a control signal is generated to a bias control network 20 which in turn produces a signal to adjust the bias of the oscillator 16 until a frequency lock occurs. Thus, by means of the oscillator 16, the circuit 18 and the control network 20, a measurement of the high-frequency output of the oscillator 10 is made. This measurement appears as the output frequency of the subharmonic oscillator 16.

An output from the oscillator 16 is applied to an arithmetic unit for determining the deviation of the output, $f_o$, of the oscillator 10 from the desired frequency, $f_d$, represented by a digital word stored in the register 14. Initially, the output of the oscillator 16 passes through a flip-flop divider 22 that divides the subharmonic output of the SHO by some fixed number. The necessity of dividing the output of the oscillator 16 results from the particular embodiment of the invention shown. When the network for actually determining the error frequency is capable of handling the output frequency of the oscillator 16, the flip-flop divider 22 may be eliminated.

To count the output cycles of the oscillator 16 as they appear at the output of flip-flop 22, a gate 24 is opened by the leading edge of a timing pulse 30 from a reference oscillator 26. In addition to supplying the timing pulse to the gate 24, the reference oscillator 26 provides timing signals to a logic control clock 28 that produces a timing pulse sequence for operation of the arithmetic unit as to be described. Upon the occurrence of the leading edge of the timing pulse 30 from the oscillator 26, the output of the flip-flop 22 is gated into a counter register 32. The number of cycles passed through the gate 24 is controlled by the length of the pulse 30. Thus, the number of cycles passed through the gate 24 into the counter 32 during the duration of the pulse 30 gives an accurate measurement of the output frequency of the oscillator 16.

After the frequency of the oscillator 16 has been counted and converted into a digital word by the counter 32, a timing pulse from the logic control clock 28 shifts the counter information into a register 34. At the same time, a digital word representing the desired frequency output of the oscillator 10 is shifted into a register 36 from a control unit 38. Control unit 38 also produces a base frequency signal that connects directly to the register 14. The purpose of the base frequency signal will be explained.

SYSTEM OPERATION

At the completion of the counting cycle and the shifting of the desired frequency into the register 36 and the output of the flip-flop 22 into the register 34, a correction mode commences to subtract the information in the register 34 repeatedly from that in the register 36 until a frequency error signal remains.

To understand the operation of the correction mode to produce a frequency error signal, assume that the output of the register 14 sets the desired output frequency of the VCO 10 to $f_d$ and that the actual output frequency of the VCO is at $f_o$. At phase lock, each period of the output frequency of the SHO 16 encompasses a constant and integral number of periods of the output frequency of the VCO 10, as explained. Thus, the output frequency of the SHO 16 is $f_o/N$, where N is an unknown integer. If the value of the unknown integer N could be correctly determined, the product of the SHO output ($f_o/N$) multiplied by N would give the exact frequency of the VCO 10 ($f_o$). Comparison of the actual frequency ($f_o$) with the desired frequency ($f_d$) will result in a fine control signal which, in conjunction with the output of the control unit 38, is used to drive the output frequency ($f_o$) toward the desired frequency ($f_d$). The problem is the determination of the integer N.

If the actual output frequency of the VCO 10 is equal to $f_o$ and the desired output frequency of the VCO is given by $f_d$, then the error frequency can be defined by the following expression:

$$f_o = f_d \pm \Delta f, \qquad (1)$$

where $\Delta f$ is the error frequency (unknown). This expression can also be written as follows:

$$f_d - f_o = \mp \Delta f. \qquad (2)$$

Now if the output frequency of the SHO 16 ($f_o/N$) is set equal to $f_{so}$, that is $$f_{so} = f_o/N$$

then equation (2) can be written as follows:

$$f_d - Nf_{so} = \mp \Delta f. \qquad (3)$$

Since $N$ is unknown, equation (3) cannot be solved directly. However, by applying proper constraints on the magnitudes of the system variables, the solution of equation (3) can be realized in an indirect manner.

The desired frequency $f_d$ is represented by a digital number in the register 36 and the output frequency of the SHO 16 ($f_{so}$) is represented by a digital number stored in the register 34. Proper scaling of the timing pulse 30 will ensure that the weights of the binary bits representing $f_{so}$ in the register 34 are the same as the weights representing $f_d$ in the register 36. With this equality established, the correction mode commences to subtract the information in the register 34 repeatedly from the information in the register 36 until, if one more subtraction were made, a negative number would be generated. The remainder from these repetitive subtractions represent ($\Delta f$) or ($f_{so}-\Delta f$) (the results of $N$ or $N-1$ subtractions, respectively).

If the maximum frequency error ($\Delta f$ max) is restricted to be less than $f_{so}$ min/2 (determined from prior knowledge of the approximate tuning characteristics of the VCO 10) then a remainder ratio test can be used to determine when N subtractions have been performed.

A statement of the remainder ratio test is:

If, when one more subtraction would result in a negative number, the ratio of the remainder (right-hand side of equation 3) to $f_{so}$ is less than ½, then exactly $N$ subtractions have been made. If the ratio if greater than ½, then exactly $N$ subtractions have been made. If the ratio is greater than ½however, then only $N-1$ subtractions have been made and one more subtraction is necessary.

In equation (3), assume $f_o = f_d - \Delta f$ ($f_o$ too low), then $f_d - Nf_{so} = +\Delta f$ and by applying the ratio test:

$$\frac{\text{remainder}}{f_{so}} = \frac{\Delta f}{f_{so}} < 1/2 \left(\text{since } \Delta f \max < \frac{f_{so}\min}{2}\right) \qquad (4)$$

Thus, the test indicates that $N$ number of subtractions have been made and $+\Delta f$ represents the correct frequency error signal. Next select $f_o = f_d + \Delta f$ ($f_o$ too high), then $f_d - Nf_{so} = -\Delta f$. The usual digital logic will not subtract the one additional step that results in a negative number. Instead, it automatically stops on the $N-1$ subtractions giving:

$$f_d - (N-1)f_{so} = f_{so} - \Delta f.$$

Since one more subtraction gives a negative number, the ratio test can be used to see if the correct number of subtractions has been performed. The ratio test for this situation is written as follows:

$$\frac{\text{remainder}}{f_{so}} = \frac{f_{so} - \Delta f}{f_{so}} = \left[1 - \frac{\Delta f}{f_{so}}\right] > 1/2 \qquad (5)$$

$$\left(\text{since } \Delta f \max < \frac{f_{so}\min}{2}\right) \qquad (6)$$

Because the results of the ratio tests in this situation is a number greater than one-half, then only $N-1$ subtractions have been made. The system of FIG. 1 will artificially perform one more subtraction to obtain the correct error frequency ($-\Delta f$).

From the above mathematical explanation of the correction mode, the system of FIG. 1 will determine the magnitude and polarity of the correction necessary to drive the output frequency of the VCO 10 to the desired frequency $f_d$. Note, although mathematically necessary to explain the system operation, the number $N$ is not actually calculated. Only the error signal is physically required.

With the system of FIG. 1, subtraction is performed serially by shifting the binary representations of the frequencies from the registers 34 and 36 serially into an adder network 40. Subtraction is performed in the two's complement. The binary number to be subtracted is complemented and a logic ONE added to the least significant bit. After the number has been complemented, subtraction is performed by adding the two numbers. In the system shown, the output of the register 34 is complemented and added to the binary bits in the register 36 representing the desired frequency $f_d$.

Once the error frequency has been determined by repeated addition of the binary words in the registers 34 and 36, the resulting error is stored in the register 36 and subsequently transferred to the register 14 through a gate 42 that may form part of the network 40. The register now includes a binary code representing the desired frequency ($f_d$) plus the error frequency $\Delta f$ (including the algebraic sign). By operation of the digital-to-analog converter 12, the control oscillator 10 is now tuned to the desired frequency.

SUBHARMONIC OSCILLATOR

Figure 2:
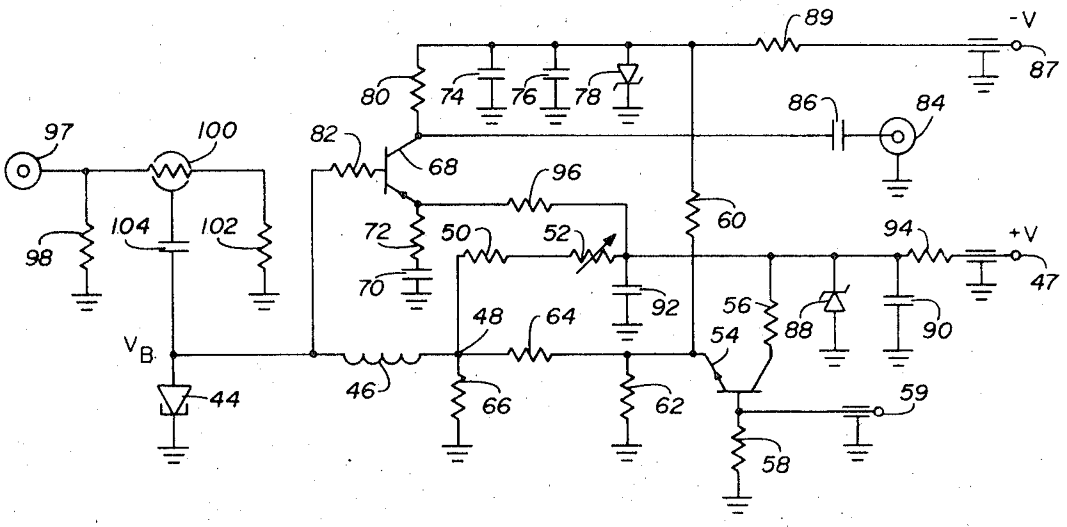
FIG. 2 is a schematic of a tunnel diode subharmonic oscillator for counting the frequency output of an oscillator.

To consider the system of FIG. 1 in greater detail, a schematic of a subharmonic oscillator is illustrated in FIG. 2. The subharmonic oscillator is an astable tunnel diode (TD) oscillator that oscillates in synchronism with the VCO frequency to produce an output frequency at a subharmonic thereof. The oscillator includes a tunnel diode 44 that is designed to oscillate over a given frequency range. The particular operating frequency is controlled by an inductor 46 and a bias voltage applied to the inductor at a terminal 48. The primary current drive for the tunnel diode 44 is through resistors 50 and 52 connected to a stable voltage established by a Zener diode 88, capacitor 90 and a resistor 94 connected to the positive side of a DC source (not shown) at terminal 47. Variable resistor 52 provides a means of tuning the frequency of the oscillator.

In addition to the primary current drive through resistors 50 and 52, the frequency of the tunnel diode 44 is also controlled by a signal to the base electrode of a transistor 54 at a terminal 59. A collector voltage for the transistor 54 is established by a connection to the resistor 94 through a resistor 56. The emitter-follower configuration of transistor 54 includes resistors 58, 60 and 62 and serves as a variable voltage source to change the bias voltage $V_B$ across the tunnel diode 44. This bias voltage is applied to the tunnel diode through a network of resistors 64 and 66. Resistors 56, 60 and 62 are biasing resistors for the transistor 54 and are not considered to influence the overall performance of the oscillator.

Since a tunnel diode oscillator may be sensitive to loading, an amplifier stage including a transistor 68 isolates the tunnel diode 44 from the lock circuit 18 connected to the terminal 84. This amplifier stage further acts as a bandpass filter by rejecting the input signal frequency at the terminal 94 from the voltage controlled oscillator 10, and low-frequency noise caused by power supply ripple. A capacitor 70 and a resistor 72, connected to the emitter electrode of the transistor 68, establishes the lower cutoff frequency while the transistor 68 controls the upper cutoff frequency. The isolation amplifier that includes the transistor 68 receives the tunnel diode frequency through a base resistor 82 and transmits the tunnel diode frequency to the terminal 84 through the capacitor 86.

To provide a smooth regulated collector voltage for the transistor 68, capacitors 74 and 76 are connected to the anode electrode of a ZENER diode 78 which is also connected to the negative side of a DC source at terminal 87 through a dropping resistor 89. A resistor 80 establishes the collector voltage of the transistor 68.

Emitter voltage for the transistor 68 is established by a circuit that includes the ZENER diode 88 and capacitors 90 and 92 connected to the positive terminal of a DC supply through the resistor 94. A resistor 96 establishes the emitter voltage for the transistor 68.

An input signal to the tunnel diode oscillator from the VCO at the terminal 97 to which the subharmonic oscillator 16 is synchronized is injected at the anode electrode of the tunnel diode 44 through a network consisting of resistors 98, 100 and 102 along with a capacitor 104. This network is designed to pass signals in a desired frequency range and to reject feedback from the tunnel diode oscillator to the high-frequency driving force. When the VCO output frequency ($f_o$) is applied to the tunnel diode oscillator, the tunnel diode oscillator frequency adjusts itself to a subharmonic of the VCO output under the control of the bias control 20 as connected to the terminal 59. This subharmonic frequency is amplified by the transistor 68 and appears at the output terminal 84. To vary the oscillator frequency by the bias control 20, an output frequency at the terminal 84 is applied to the input terminal 106 of the lock circuit 18.

Figure 3:
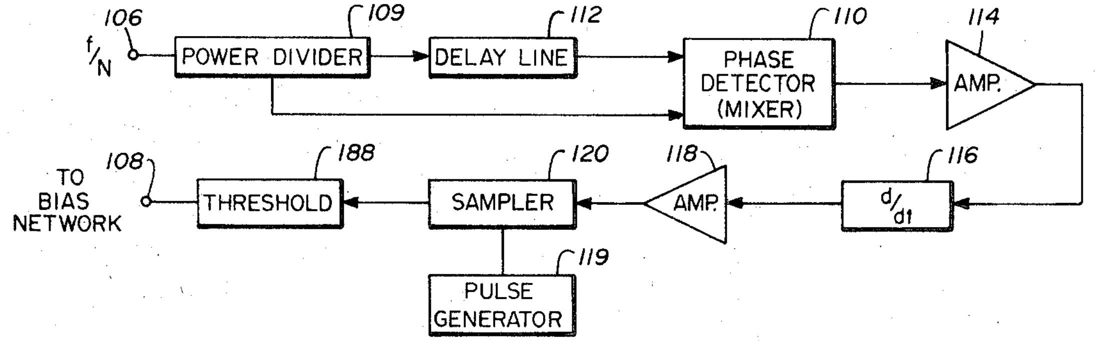
FIG. 3 is a block diagram of a system for determining if the output frequency of the subharmonic oscillator of FIG. 2 is locked to its input frequency.

Referring to FIG. 3, subharmonic oscillator frequency instability is detected by a circuit which provides a signal to the bias control network 20 at an output terminal 108. The subharmonic oscillator signal at the terminal 84 is split into two transmission paths by a powder divider 109. Each path terminates at a mixer 110, connected as a phase detector. One path transmits the subharmonic oscillator output directly to the mixer 110 while the second path includes a delay line 112 which typically introduces a 20-nanosecond delay into the signal prior to applying to the mixer 110. When the output of the subharmonic oscillator is not locked to the input applied thereto, the phase angle between the delayed signal and the undelayed signal varies at random. The resulting phase information is detected by the phase detector mixer 110. The phase detector mixer output is a DC voltage with an AC component and is applied to the input of an amplifier 114. The amplitude of this AC component is a direct function of the amount of phase jitter between the delayed and undelayed signal applied to the mixer 110. Since the information of SHO 16 instability appears in the AC component, the output of the amplifier 114 is applied to a differentiator 116 to remove the DC component. The resulting AC component from the differentiator 116 is coupled to an amplifier 118 and then to a sampler circuit 120.

Figure 4:
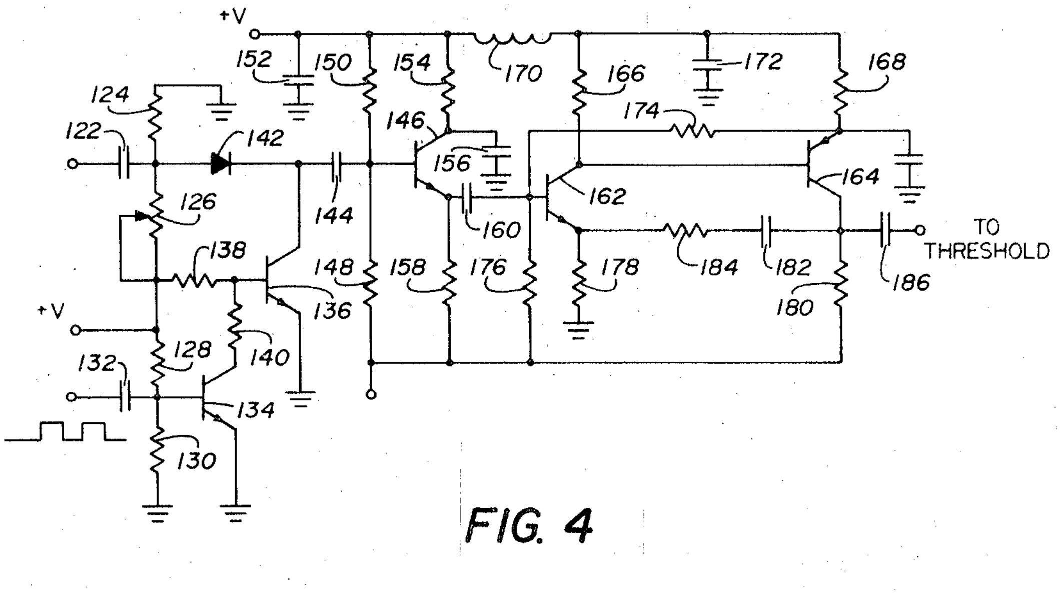
FIG. 4 is a schematic of a sampling circuit for the system of FIG. 3.

Referring to FIG. 4, there is shown a schematic of a sampling circuit wherein the sampling time is adjusted to pass only the differential of the AC component. An input to the sampler unit 120 from the amplifier 118 is applied through a capacitor 122 to a network of resistors 124, 126, 128 and 130. Timing pulses to the sampling circuit are supplied through a capacitor 132 to the junction of resistors 128 and 130 and the base electrode of a transistor 134. Also included in the input of the sampling circuit is a transistor 136 having a base electrode coupled to resistors 138 and 140 and a collector electrode connected to a diode 142 and a capacitor 144. Capacitor 144 provides coupling to the base electrode of an emitter-follower amplifier consisting of a transistor 146. The base drive circuit for the transistor 146 includes resistors 148 and 150 connected to the negative and positive terminals, respectively, of a DC voltage source. A smoothing capacitor 152 also connects to the resistor 150. The collector electrode voltage for the transistor 146 is established by a resistor 154 and a capacitor 156 and the emitter circuit includes a resistor 158 and a coupling capacitor 160 which connects to the base electrode of the next amplifying stage consisting of a transistor 162. Transistor 162 amplifies the emitter voltage of the transistor 146 and applies it to the base electrode of an output stage of the sampling circuit; the output stage includes transistor 164.

Transistors 162 and 164 are coupled to a DC voltage supply through resistors 166 and 168, respectively. An inductor 170 and a capacitor 172 provide decoupling between the transistors 162 and 164. A base bias voltage for the transistor 162 is established by a network of resistors 174 and 176. The emitter circuit for the transistor 162 includes a resistor 178 connected to ground. The collector circuit of the transistor 164 includes a resistor 180. A feedback path including a capacitor 182 and a resistor 184 ties the collector electrode of the transistor 164 to the emitter electrode of the transistor 162. A coupling capacitor 186 transfers the output of the sampling circuit at the collector of the transistor 164 to a threshold detector 188 as illustrated in FIG. 3.

The sampling unit shorts all signals applied to the capacitor 122 to ground through the transistor 136 when the base voltage to the transistor 134 is low. When a timing signal from a pulse generator 119 applied through the capacitor 132 to the base of the transistor 134 is high, transistor 134 turns on thereby driving the transistor 136 into an off state. With transistor 136 in the off state, the differentiated AC component from the differentiator 116 is gated to the emitter-follower comprising the transistor 146 and amplified by transistors 162 and 164. The emitter-follower output signal from the transistor 146 appears amplified at the collector electrode of the transistor 164 and includes a threshold component and the differentiated AC component. This signal is applied to the threshold detector 188.

Figure 5:
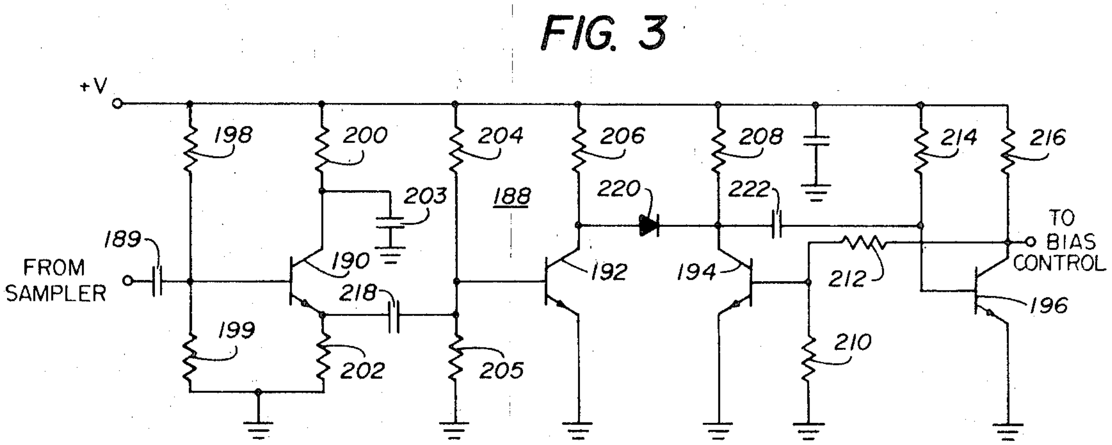
FIG. 5 is a schematic of a threshold detection circuit for lock control with the system of FIG. 3.

Referring to FIG. 5, there is shown a schematic of a threshold detector with the output signal from the sampler unit 120 applied through a capacitor 189 to the base electrode of a transistor 190 which forms an emitter-follower amplifier driving the threshold detector transistor 192. The remaining transistors of the threshold circuit (transistors 194 and 196) function as a monostable multivibrator. Biasing voltages for the transistor 190 are established by resistors 198 through 202 and a bypass capacitor 203. Voltage levels for the transistor 192 are established by resistors 204 through 206. The collector circuit of the transistor 194 includes a resistor 208; the base circuit includes resistors 210 and 212. The multivibrator output at the transistor 196 has voltage levels established by a base resistor 214 and a collector resistor 216. Interstage coupling between the transistors 190 and 192 is provided by a capacitor 218. Transistors 192 and 194 are collector coupled through a diode 220 and the multivibrator transistors 194 and 196 are coupled through a timing capacitor 222.

When the output of the subharmonic oscillator 16 is locked to its input, the differential of the AC component of the differentiator 116 is zero and the output of the sampler 120 will be below the threshold level of the circuit of FIG. 5. When the subharmonic oscillator output is not locked to its input, the differential of the AC component of the differentiator 116 is not zero and the threshold circuitry will trigger the monostable multivibrator of FIG. 5 and provide a signal to the bias control network 20 from the collector electrode of the transistor 196.

Figure 6:
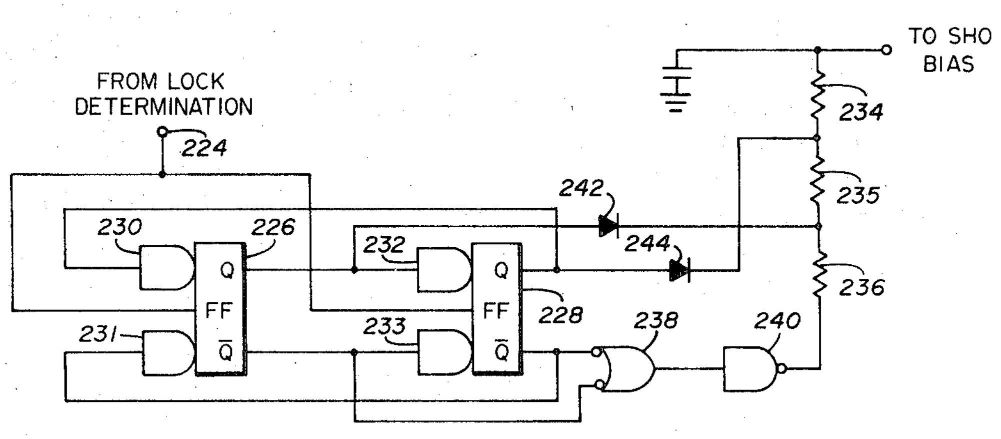
FIG. 6 is a block diagram of a bias control network responsive to the output of the lock determining system of FIG. 3 for varying the bias voltage to the subharmonic oscillator of FIG. 2.

Referring to FIG. 6, there is shown a block diagram of a bias control network where the output of the threshold detector 188 appearing at the terminal 108 is applied to an input terminal 224 as a clock pulse to flip-flops 226 and 228. As interconnected through the gates 230 through 233, the flip-flops 226 and 228 change stage at each clock pulse from the threshold detector 188. As the stage of the flip-flops 226 and 228 change, the bias voltage to the base electrode of the transistor 54, referring to FIG. 2, changes to one of three bias levels. The three bias levels are established by the resistors 234 through 236 along with the logic level as established by the gates 238 and 240 and conduction of the diodes 242 and 244. The circuit will change its output voltage whenever a pulse appears at the input terminal 224. Typically, the circuit of FIG. 6 provides bias voltages of 1.2, 1.4 and 1.6 volts to the base electrode of the transistor 54. The circuit will step through these three voltages until the subharmonic oscillator 16 is locked to the output of the VCO; it then maintains this voltage.

Figure 7:
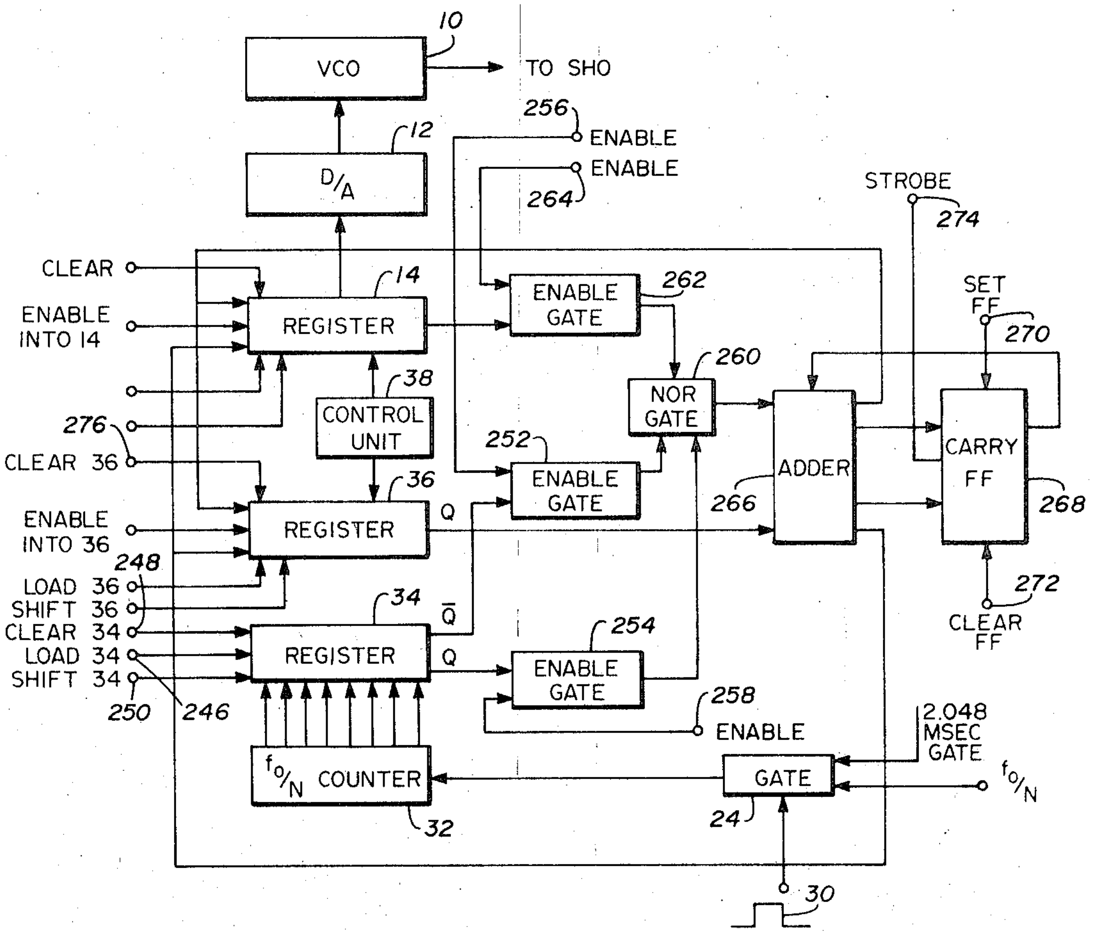
FIG. 7 is a block diagram of an arithmetic unit for calculating the error frequency of the output of a controllable oscillator from a desired level.

Referring to FIG. 7, there is shown the arithmetic unit receiving the output of the subharmonic oscillator 16 through the divide-by-two flip-flop 22 for generating the error frequency signal to correct the output of the voltage controlled oscillator 10 in the correction mode as defined previously. This unit performs two functions; (1) it provides the digital word representing the desired frequency ($f_d$) to the D/A converter 12, and (2) it provides a digital correction signal that corrects for the error frequency $\Delta f$.

To determine the error frequency, the output of the subharmonic oscillator 16 through the divide-by-two flip-flop 22 at a frequency of $f/2N$ along with the timing pulse 30 are applied to the gate 24, as explained. The timing pulse 30 from the oscillator 26 is scaled such that it enables the counter 32 to store a binary word representing the output frequency $f/2N$ of the oscillator 16. This binary word is shifted into the register 34 upon the occurrence of a shift pulse at the terminal 246. Prior to loading the register 34 with the frequency measurement from the counter 32, a register clear pulse was applied to terminal 248 to clear this register. After the frequency $f/2N$ has been shifted into the register 34, a shift pulse appearing at the terminal 250 causes the binary train of pulses in the register 34 to be transferred to enable gates 252 and 254. At the correct timing sequence as determined by the logic control clock 28, a clock pulse will appear at either terminal 256 or 258 to transfer a binary word to a NOR gate 260. Another sequence of pulses that may be applied to the NOR gate 260 at the correct time in the sequence is the binary word from the register 14 through enable gate 262. A binary word from the register 14 will be transferred to the NOR-gate 260 when a clock pulse from the logic control clock 28 appears at the terminal 264.

Binary information coupled to the NOR-gate 260 is transferred to an adder 266. Also coupled to the adder 266 is the binary word stored in the register 36. The adder 266 produces logic signals that are applied to input terminals of the registers 14 and 36 and a carry flip-flop 268. The carry flip-flop 268 receives a SET pulse on terminal 270, a CLEAR pulse on terminal 272, and a STROBE pulse on terminal 274.

In operation of the arithmetic unit, after the output frequency of the subharmonic oscillator 16 has been counted and stored in the counter 32, the logic control clock 28 generates a clearing pulse at the terminals 248 and 276 to clear the registers 34 and 36, respectively. After the registers 34 and 36 have been cleared, the frequency of the oscillator 16 through the flip-flop 22 is transferred from the counter 32 into the register 34 and the desired frequency is transferred from the control unit 38 into the register 36. The register 36 is cleared and loaded only once during the correction mode while the register 34 is cleared and loaded at the beginning of each cycle in the determination of the error frequency.

When the output frequency ($f/2N$) of the flip-flop 22 is transferred into the register 34, it is multiplied by a factor of 16. The third bit of the counter 32 becomes the first bit of the register 34, the fourth bit becomes the second bit and the sixteenth bit the fourteenth bit. The two most significant bits in the register 34 are thus always logic ZERO. The ZERO'S in the two most significant bits assure that the binary word for $16(f/2N)$ in the register 34 is always less than the desired frequency $f_d$.

After the registers 34 and 36 have been loaded, the arithmetic unit of FIG. 7 is ready to start the subtraction process to determine the error frequency, as explained. These subtractions are performed by adding the two's complement of $16(f/2N)$ to $f_d$. To subtract the contents of register 34 from contents of register 36, the information on the Q-line of the register 34 is shifted into the adder 266 through the enable gate 252 which is enabled for subtraction by an enable pulse at the terminal 256. While the subtraction is in progress, the enable gate 254, which allows the information on the Q-line of the register 34 to be shifted into the adder 266, is inhibited. The enable gate 254 will be open when the arithmetic operation calls for an addition process.

To complete a subtraction, the carry input from the carry flip-flop 268 to the adder 266 must be set at logic ONE before the first bits are added. After the correct enable gate has been opened, and the carry flip-flop 268 set, the contents of registers 34 and 36 are shifted bit by bit into the adder 266. The "sum" from the adder 266 is shifted back into the register 36 bit by bit with the least significant bit shifted into the most significant bit position and shifted to the right with each shift pulse. Thus, when the subtraction of $16(f/2N)$ from $f_d$ is complete, the difference is stored in the register 36.

Next, the digital word in the register 36 will be tested to determine if it is a positive or negative number in accordance with the remainder test. When the result is positive, no arithmetic function is performed in an addition (ADD) cycle. The next arithmetic function will then be performed in the next subtraction (SUB) cycle as just explained. When the remainder is negative after $16(f/2N)$ has been subtracted from $f_d$, the negative remainder is restored to the last positive remainder. To restore to a positive remainder, $16(f/2N)$ is added to the negative remainder during an addition cycle which is completed by enabling the gate 254 with a pulse at the terminal 258. This last addition cycle completes the subtraction of $16(f/2N)$ from $f_d$ and the operation continues with the subtraction of $8(f/2N)$ from $f_d$ during the next SUB cycle.

Figure 8:
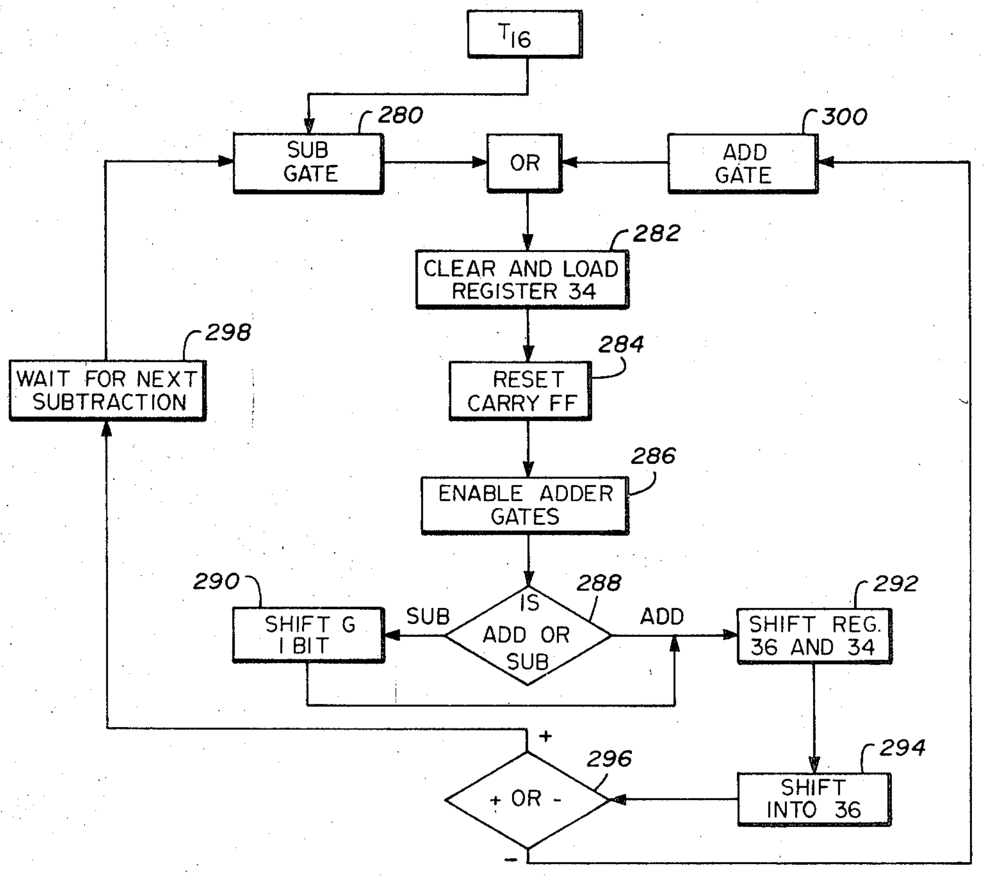
FIG. 8 is a flow chart of the subtraction operation steps completed by the unit of FIG. 7.

Referring to FIG. 8, there is shown a flow chart of one addition and subtraction cycles for a multiple of the subharmonic oscillator output frequency $f/N$ from the desired frequency $f_d$. Upon receiving the first timing pulse from the logic control clock 28, the first step in a cycle is to enable the subtraction gate 252 as identified by block 280. The next step, 282, is to clear and load the register 34 from the counter 32. Upon completion of step 282, step 284 is completed to reset the carry flip-flop 268 by a timing signal on the terminal 270. After resetting the carry flip-flop 268, a timing signal enables the appropriate gate as indicated by block 286, and inquiry 288 is then made to determine if the sequence calls for the subtraction or the addition of a multiple of $f/2N$ to the previous remainder. If the inquiry 288 produces a SUB answer, step 290 is completed and the binary word in the register 34 is shifted one bit. If the result of inquiry 288 is an ADD answer (addition cycle) or upon completion of step 290, the data from registers 34 and 36 is shifted into the adder 266 at step 292 to complete the subtraction or addition sequence. The result of step 292 is shifted into the register 36 at step 294 and the result tested in inquiry 296 to determine whether the remainder is positive or negative. If the result of inquiry 296 is positive, the sequence holds at step 298 for the next timing pulse. A negative remainder at inquiry 296 activates the ADD-gate 254 at step 300. Upon activating the ADD-gate 254, the steps 282, 284, 286, 292 and 294 are repeated and the result of inquiry 296 will now be positive causing the system to hold at step 298. Upon the occurrence of the next timing pulse, the step 280 enables the subtraction gate 252 and the process is repeated. The number of times that the sequence of FIG. 8 is repeated depends upon the mechanization of the arithmetic unit of FIG. 7.

Figure 9:
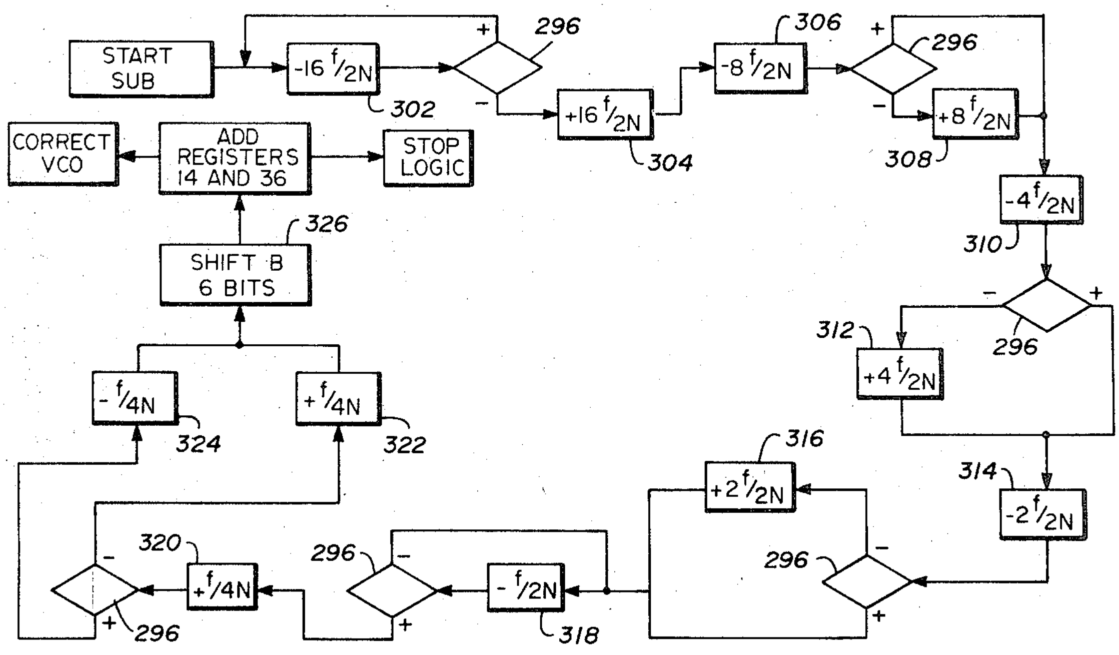
FIG. 9 is a flow chart of the subtraction sequence performed by the unit of FIG. 7.

Using the previous example where $16(f/2N)$ was subtracted from $f_d$ in the first sequence of FIG. 8, a complete sequence of $f/2N$ subtraction is given in FIG. 9. The $f/2N$ frequency from the flip-flop 22 is multiplied by 16 and subtracted from $f_d$, block 302, with the remainder stored in the register 36. When the remainder is positive, inquiry 296, $16(f/2N)$ is again subtracted until a negative remainder occurs. This negative remainder is restored to the last positive value remainder by adding $16/2N$ to the contents of register 36. This comprises one complete sequence of the flow chart of FIG. 8.

At the next timing pulse, the $f/2N$ frequency is multiplied by 8 and subtracted from the contents of register 36, block 306, that is, the remainder from the previous sequence. After $8(f/2N)$ has been subtracted from the remainder of register 36, inquiry 296 determines whether the result is positive or negative. If the result is negative, $8(f/2N)$ is added to the remainder to restore it to the last positive remainder in register 36. If the result of inquiry 296 upon completion of the addition of $8(f/2N)$ to the remainder is positive, then upon the occurrence of the next timing pulse the sequence of FIG. 8 is repeated subtracting $4(f/2N)$ from the remainder of register 36, block 310. Inquiry 296 again determines a positive or negative remainder. A negative remainder restores the code in the register 36 by adding $4(f/2N)$. A positive response to inquiry 296 after subtracting $4(f/2N)$ or upon the completion of step 312 advances the sequence of FIG. 8 to a hold status, step 298, until the next timing pulse occurs. The next timing pulse activates a sequence to subtract $2(f/2N)$ from the previous remainder or register 36, block 314. A negative response to inquiry 296 indicates $2(f/2N)$ must be added to the remainder of register 36, block 316, to restore it to a positive value. Another sequence of FIG. 8 has been completed and the next timing pulse subtracts $f/2N$, block 318, from the remainder of register 36. A positive result to inquiry 296 repeats the subtraction of $f/2N$ from the remainder, and this is repeated until the inquiry 296 produces a negative result. Upon the occurrence of a negative result, the value $f/2N$, block 320, is added to the remainder of the register 36 and the inquiry 296 is again made. A negative response to inquiry 296 adds $f/4N$, block 322, to the remainder of register 36 and a positive response to inquiry 96 subtracts $f/4N$, block 324, from the remainder.

After $(f/2N)$, block 318, has been subtracted from the register 36, this register contains a digital word (Rx) which is:

$$-f/4N \le Rx \le f/2N. \qquad (1)$$

The correction factor for the oscillator 10, however, has to be:

$$-f/4N \le \Delta f \le f/4N. \qquad (2)$$

When Rx is positive, $f/2N$ is subtracted again from the remainder in register 36 until the remainder is negative. The code in register 36 may now be $\Delta f$, $\Delta f - f/4N$ or $\Delta f - f/2N$. The error frequency, $\Delta f$, is obtained with its proper polarity by adding $f/4N$, and subtracting $f/4N$ from the positive remainder or adding $f/4N$ to the negative remainder. This is indicated by blocks 322 or 324, respectively. Once the error frequency, $\Delta f$, has been determined, it is stored in the register 36.

As a result of the mechanization described, the error frequency $\Delta f$ in the register 36 is 32 times the desired error. The digital word in the register 36 is divided by the factor 32, block 326, and added to the contents of registers 14 and 36, block 328. When the addition is complete, register 14 tunes the voltage controlled oscillator 10, block 330, to the frequency $f_o + \Delta f$, which equals $f_d$, to complete the loop operation, as indicated by block 332. The oscillator 10 then operates at a frequency $f_d$ until the cycle is completed for a different frequency or until an unintentional drift produces an error.

In the complete operation of the system of FIG. 1, the system is first tuned in the open loop mode. The open loop mode is activated by a start signal which sets all the registers and counters to their initial state. Once the system has been set, a clock in the logic control clock 28 is activated to synchronize operation of the system.

After the registers 14, 34 and 36 have been cleared and the timing sequence started, the control unit 38 generates the desired frequency for the oscillator 10, which is loaded into the register 36, and also a base-band frequency which is loaded into the register 14. Upon the completion of the transfer of the binary words for the base-band and the desired frequency into their respective registers, a signal enables the gate 262 to commence the subtraction of the base-band frequency from the desired frequency. This subtraction is performed in the arithmetic unit shown in FIG. 7 wherein the gate 262 is enabled. The binary numbers for the base-band from register 14 and the desired frequency from register 36 are serially shifted bit by bit and subtracted in the adder 262. Again, the binary number for the base-band is translated into the two's complement and added to the desired frequency.

The result of this addition is shifted back into the register 14 on a bit basis. The register 14 now provides the digital-to-analog converter 12 with a digital word that tunes the voltage-controlled oscillator 10 to the frequency $f_o$. The timing clock is now stopped until the frequency $f/2N$ has been counted by the counter 32, as explained.

When the oscillator 10 has settled to the desired frequency plus or minus an error frequency, the subharmonic oscillator 16 will lock to the oscillator 10 frequency. After the subloop including the lock circuit 18 and the bias control network 20 have locked the oscillator 16 to the output of the oscillator 10, the master oscillator 26 enables the counter 32 for 2.048 milliseconds. At the trailing edge of the 2.048-millisecond gate, a closed-loop correction mode is activated. Since the counter 32 completes the counting of the $f/2N$ frequency upon the trailing edge of the 2.048-millisecond gate, the closed-loop mode commences upon completion of this counting sequence. In the closed-loop mode, the first operation is to clear the registers 34 and 36 and load the desired frequency into the former and the output of the oscillator 16 into the latter. The sequence of operation as illustrated in FIG. 8 and expanded in FIG. 9 is completed by timing signals from the logic control clock 28 until the error frequency has been determined. This error frequency is added to the contents of the register 14 which sends a correction signal to the digital-to-analog converter 12.

Although only one embodiment of the invention, together with modifications thereof, has been described in detail herein and shown in the accompanying drawings, it will be evident that various further modifications are possible.

What is claimed is:

1. In a system for controlling the output frequency of a variable frequency source, comprising:

control means responsive to a desired frequency input and an error frequency input for generating a control signal to the variable source to establish an output frequency therefrom, divider means responsive to the output frequency of the variable source for producing a frequency locked at a submultiple of the actual frequency of said source, means for repetitively subtracting the output frequency of said divider means from the desired frequency signal to produce a remainder frequency, means receiving the remainder frequency signal after each subtraction of said divider means output frequency from the desired frequency signal to stop said repetitive subtractions when one additional subtraction will result in a negative remainder, and means responsive to the last remainder frequency from said means for repetitive subtracting to generate an error frequency signal equal to the difference between the desired frequency of the variable source and the actual frequency of said source, said error frequency signal coupled to the error frequency input of said control means.

2. In a system for controlling the output frequency of a variable frequency source as set forth in claim 1 wherein the minimum output frequency of said divider means divided by two is greater than the maximum design error frequency as determined from prior knowledge of the tuning characteristics of the frequency source.

3. In a system for controlling the output frequency of a variable frequency source as set forth in claim 1 wherein said means responsive to the last remainder frequency includes means for determining if the last remainder is equal to the error frequency or the output frequency of said divider means less the error frequency.

4. In a system for controlling the output frequency of a variable frequency source as set forth in claim 1 wherein said means responsive to the last remainder frequency includes means for completing one subtraction of the output frequency of said divider means from the desired frequency signal when the remainder frequency equals the output frequency of said divider means less the error frequency.

5. In a system for controlling the output frequency of a variable frequency source, comprising:

control means responsive to a desired frequency input and an error frequency input for generating a control signal to the variable source to establish an output frequency therefrom, divider means responsive to the output frequency of the variable source for producing an output frequency locked at the submultiple of the actual frequency, lock control means responsive to the output of said divider means for generating a frequency-lock signal to said divider means to fix the output thereof at a predetermined fraction of the source frequency output, and means for subtracting the output frequency of said divider means from the desired frequency signal in a manner that produces an output therefrom equal to the error frequency signal representing the difference between the desired frequency of the variable source and the actual frequency of said source, said error frequency signal connected to the error frequency input of said control means.

6. In a system for controlling the output frequency of a variable frequency source as set forth in claim 5 wherein said means for subtracting the output frequency of said divider means from the desired frequency signal produces the error frequency signal in accordance with the equation:

$$f_d - Nf_{so} = \mp\Delta f,$$

where $f_d$ equals the desired frequency, $Nf_{so}$ equals the actual frequency of the variable source, and $\Delta f$ equals the error frequency signal.

7. In a system for controlling the output frequency of a variable frequency source as set forth in claim 5 wherein said means for subtracting the output frequency of said divider means from the desired frequency signal includes logic circuitry for repetitively subtracting the two frequency signals to produce the error frequency signal.

8. In a system for controlling the output frequency of a variable frequency source as set forth in claim 5 wherein said divider means includes a tunnel diode oscillator having an input connected to the variable source and an output frequency at a submultiple of the input thereto and including a variable biasing network for said tunnel diode oscillator to set the output at a submultiple of the input.

9. In a system for controlling the output frequency of a variable frequency source as set forth in claim 5 wherein said lock control means includes a threshold detector generating an adjusting signal when the output of said divider means varies from a submultiple of the variable frequency source output.

10. In a system for controlling the output frequency of a variable frequency source as set forth in claim 10 including a bias network control means responsive to the adjusting signal for generating the frequency-lock signal connected to the variable biasing network for said tunnel diode oscillator.

11. In a system for controlling the output frequency of a variable frequency source, comprising:

control means responsive to a desired frequency input and an error frequency input for generating a control signal to the variable source, divider means responsive to the output of the frequency source for producing a frequency locked at a submultiple of the source frequency, means for converting the frequency output of said divider means into a digital bit stream representative thereof, register means for receiving and storing the digital bit stream from said converting means, second register means for receiving and storing a digital bit stream representative of the desired frequency of said variable source, means for subtracting the output of said first register means from said second register means repetitively until the output therefrom equals the error frequency signal between the desired frequency of the variable source and the actual frequency of said source, and means for coupling the error frequency signal to the error frequency input of said control means.

12. In a system for controlling the output frequency of a variable frequency source as set forth in claim 11 wherein said means for converting the frequency output of said divider means includes a pulse frequency counter and a timing gate for passing the frequency output of said divider means to said counter for a fixed time interval.

13. In a system for controlling the output frequency of a variable frequency source as set forth in claim 12 wherein said means for subtracting the digital bit streams of said registers includes:

means for generating the two's complement of the digital bit stream in said first register, and means for adding the two's complement code to the desired frequency code transferred from said second register to produce an error frequency input to said control means.

14. In a system for controlling the output frequency of a variable frequency source as set forth in claim 13 including timing means for establishing the sequence of operation of said first and second registers and said means for adding the two's complement code to the digital bit stream representing a desired frequency.

15. In a system for controlling the output frequency of a variable frequency source as set forth in claim 11 wherein said control means includes:

a third register for receiving and storing a bit stream representing the combination of a desired frequency and an error frequency, and a digital-to-analog converter for converting the code of said third register into an analog signal for controlling said frequency source.

16. In a system for controlling the output frequency of a variable frequency source, comprising:

control means responsive to a desired frequency input and an error frequency input for generating a control signal to the variable source, divider means responsive to the output of the frequency source for producing a frequency locked at a submultiple of the source frequency, lock control means responsive to the output of said divider means for generating a frequency-lock signal to said divider means to fix the output thereof at a predetermined submultiple of the source frequency output, means for converting the frequency output of said divider means into a digital bit stream representative thereof, register means for receiving and storing the digital bit stream from said converting means, second register means for receiving and storing a digital bit stream representative of the desired frequency of said variable source, means for subtracting the output of said first register means from said second register means repetitively until the output therefrom equals the error frequency signal between the desired frequency of the variable source and the actual frequency of said source, and means for coupling the error frequency signal to the input of said control means.

17. In a system for controlling the output frequency of a variable frequency source as set forth in claim 16 wherein said divider means includes a tunnel diode oscillator having an input connected to the variable source and an output frequency at a submultiple of the input thereto and including a variable biasing network for said tunnel diode oscillator to set the output at a submultiple of the input.

18. In a system for controlling the output frequency of a variable frequency source as set forth in claim 17 wherein said lock control means includes a threshold detector generating an adjusting signal when the output of said divider means varies from a locked-in submultiple of the variable frequency source output.

19. In a system for controlling the output frequency of a variable frequency source as set forth in claim 18 including a bias network control means responsive to the adjusting signal for generating the frequency-lock signal connected to the variable biasing network for said tunnel diode oscillator.

20. In a system for controlling the output frequency of a variable frequency source as set forth in claim 19 wherein said means for subtracting the digital bit streams of said registers includes:

means for generating the two's complement of the digital bit stream in said first register, and means for adding the two's complement code to the desired frequency code transferred from said second register to produce an error frequency input to said control means.

21. In a system for controlling the output frequency of a variable frequency source as set forth in claim 20 wherein said control means includes:

a third register for receiving and storing a bit stream representing the desired frequency and a bit stream representing the error frequency, and a digital-to-analog converter for converting the code of said third register into an analog signal for controlling said frequency source.

* * * * *